(12) United States Patent
Dobner et al.

(10) Patent No.: US 12,087,743 B2
(45) Date of Patent: Sep. 10, 2024

(54) LIGHT-EMITTING WINDOW ELEMENT AND MOTOR VEHICLE COMPRISING A LIGHT-EMITTING WINDOW ELEMENT

(71) Applicant: OSRAM Opto Semiconductors GmbH, Regensburg (DE)

(72) Inventors: Andreas Dobner, Wenzenbach (DE); Hubert Halbritter, Dietfurt (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 399 days.

(21) Appl. No.: 17/621,060

(22) PCT Filed: Jul. 30, 2020

(86) PCT No.: PCT/EP2020/071534
§ 371 (c)(1),
(2) Date: Dec. 20, 2021

(87) PCT Pub. No.: WO2021/023620
PCT Pub. Date: Feb. 11, 2021

(65) Prior Publication Data
US 2022/0352126 A1    Nov. 3, 2022

(30) Foreign Application Priority Data
Aug. 7, 2019   (DE) .............. 10 2019 121 358.4

(51) Int. Cl.
*B60Q 3/208* (2017.01)
*B32B 17/10* (2006.01)
(Continued)

(52) U.S. Cl.
CPC .... *H01L 25/0753* (2013.01); *B32B 17/10036* (2013.01); *B32B 17/10477* (2013.01);
(Continued)

(58) Field of Classification Search
CPC .................................................. B60Q 3/208
See application file for complete search history.

(56) References Cited

U.S. PATENT DOCUMENTS 9,902,314 B1 *   2/2018   Salter .................... B60Q 3/208
9,925,915 B2 *   3/2018   Bauerle ................ B60Q 1/2696
(Continued)

FOREIGN PATENT DOCUMENTS

| | | |
|---|---|---|
| JP | 2014-235817 A | 12/2014 |
| JP | 2015-179590 A | 10/2015 |
| WO | 2015/086683 A1 | 6/2015 |

OTHER PUBLICATIONS

International Search Report issued for International Patent Application No. PCT/EP2020/071534 mailed Oct. 9, 2020, along with an English translation.

(Continued)

*Primary Examiner* — Andrew J Coughlin
(74) *Attorney, Agent, or Firm* — HAUPTMAN HAM, LLP

(57) ABSTRACT

A light-emitting window element includes a transparent first carrier layer, a transparent second carrier layer, a substrate with a plurality of light-emitting semiconductor chips arranged thereon, and an optical layer having an adjustable transparency. The substrate with the plurality of light-emitting semiconductor chips and the optical layer are arranged between the first and second carrier layers, and the first and second carrier layers, the substrate with the plurality of light-emitting semiconductor chips and the optical layer form a laminate composite.

14 Claims, 3 Drawing Sheets

Figure 4:
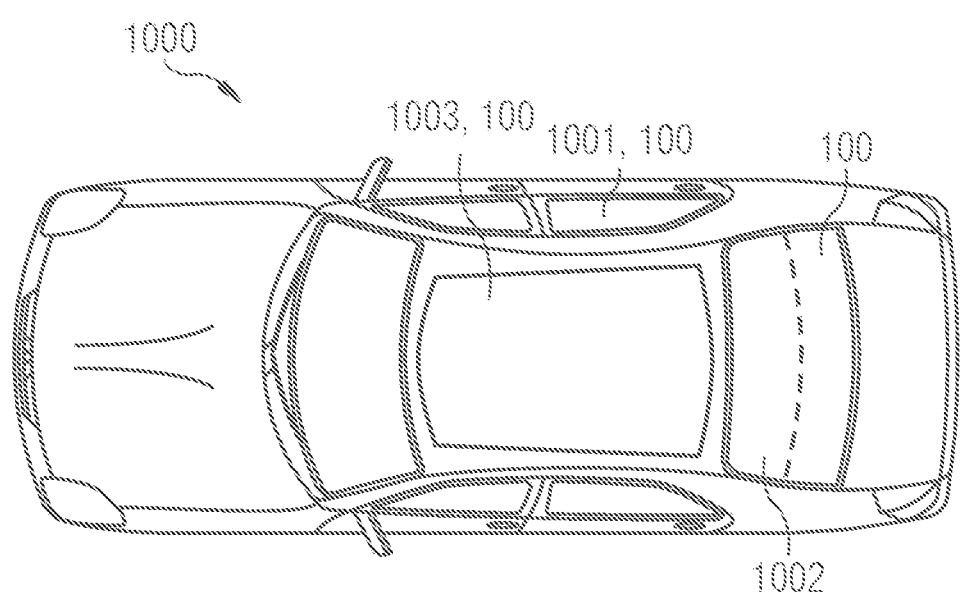

(51) Int. Cl.

| | | |
|---|---|---|
| *B60J 1/00* | (2006.01) | |
| *B60Q 1/24* | (2006.01) | |
| *B60Q 1/50* | (2006.01) | |
| *H01L 25/075* | (2006.01) | |
| *H01L 25/16* | (2023.01) | |
| *H01L 23/00* | (2006.01) | |
| *H01L 33/62* | (2010.01) | |

(52) U.S. Cl.
CPC .. *B32B 17/10504* (2013.01); *B32B 17/10513* (2013.01); *B60J 1/001* (2013.01); *B60Q 1/247* (2022.05); *B60Q 1/50* (2013.01); *B60Q 1/5035* (2022.05); *B60Q 1/507* (2022.05); *B60Q 1/543* (2022.05); *B60Q 3/208* (2017.02); *H01L 25/167* (2013.01); *B32B 2307/412* (2013.01); *B32B 2605/006* (2013.01); *H01L 24/05* (2013.01); *H01L 24/08* (2013.01); *H01L 33/62* (2013.01); *H01L 2224/05573* (2013.01); *H01L 2224/05647* (2013.01); *H01L 2224/05686* (2013.01); *H01L 2224/08145* (2013.01); *H01L 2224/08225* (2013.01); *H01L 2924/0549* (2013.01); *H01L 2924/12041* (2013.01)

(56) References Cited

U.S. PATENT DOCUMENTS

| | | | |
|---|---|---|---|
| 10,048,560 B1 * | 8/2018 | Mazuir | G02B 6/001 |
| 10,118,538 B2 * | 11/2018 | Salter | B60Q 1/544 |
| 10,525,674 B2 | 1/2020 | Linthout et al. | |
| 10,780,673 B2 * | 9/2020 | Varanasi | B32B 17/10761 |
| 2009/0046355 A1 | 2/2009 | Derda | |
| 2010/0060821 A1 | 3/2010 | Wang et al. | |
| 2014/0176836 A1 * | 6/2014 | Brecht | G02F 1/13718 349/16 |
| 2015/0165965 A1 | 6/2015 | Masaki et al. | |
| 2016/0052446 A1 | 2/2016 | Frey et al. | |
| 2016/0325529 A1 | 11/2016 | Linthout et al. | |
| 2017/0103718 A1 | 4/2017 | Miller | |
| 2019/0016198 A1 | 1/2019 | Kim et al. | |
| 2022/0352126 A1 * | 11/2022 | Dobner | B60Q 3/208 |

OTHER PUBLICATIONS

Written Opinion issued for International Patent Application No. PCT/EP2020/071534 mailed Oct. 9, 2020.

Schnitzer et al., "30% external quantum efficiency from surface textured, thin-film light-emitting diodes", Appl. Phys. Lett. vol. 63, No. 16, Oct. 18, 1993, pp. 2174-2176, cited in the Specification.

"OPAK Smart Glas", <http://schaltbaresglas.de/schaltbare-folie.htm>, along with an English machine translation.

* cited by examiner

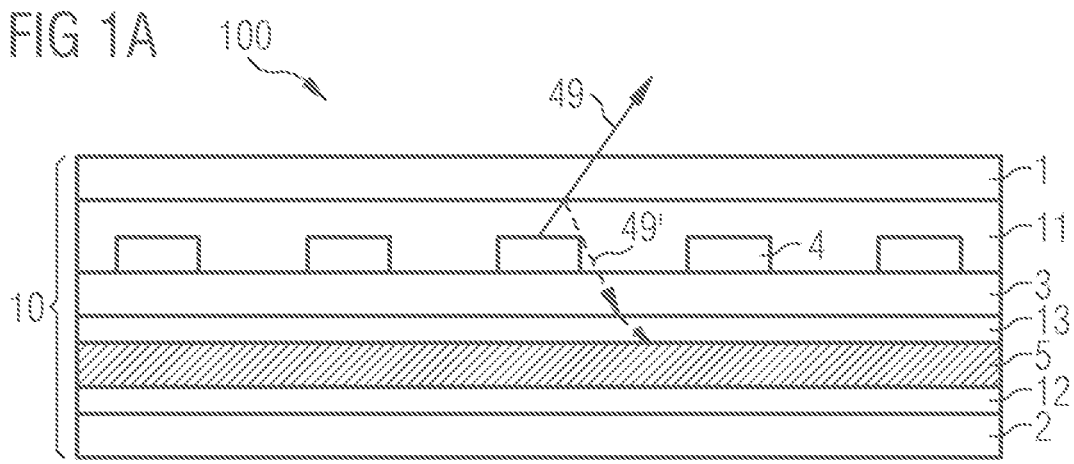
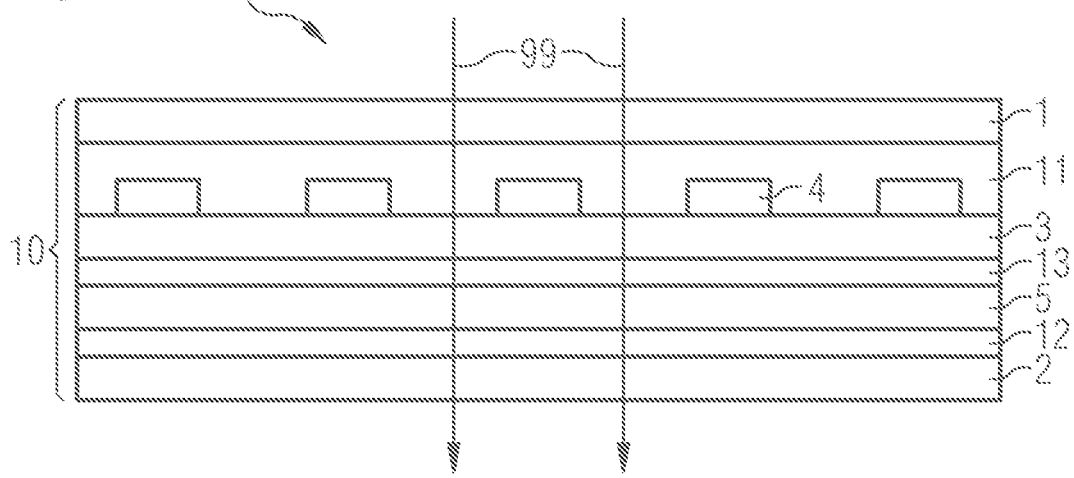
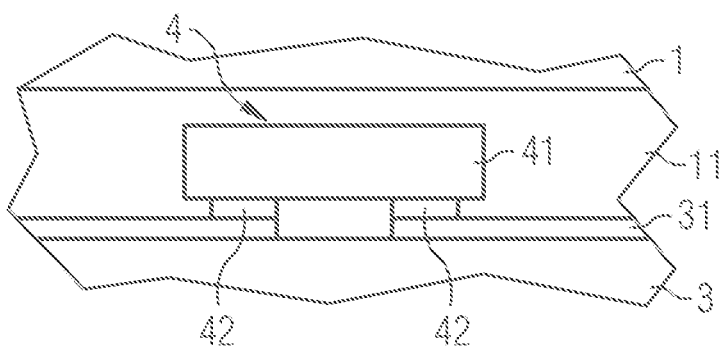

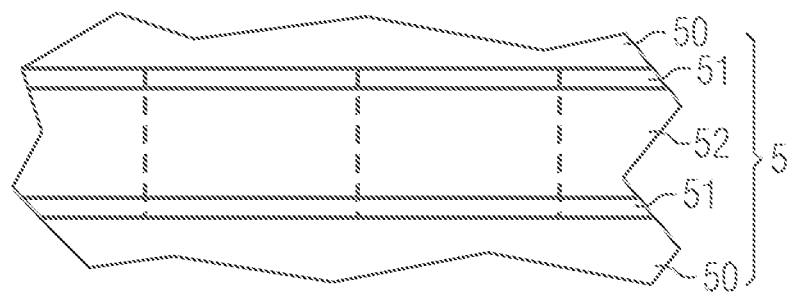
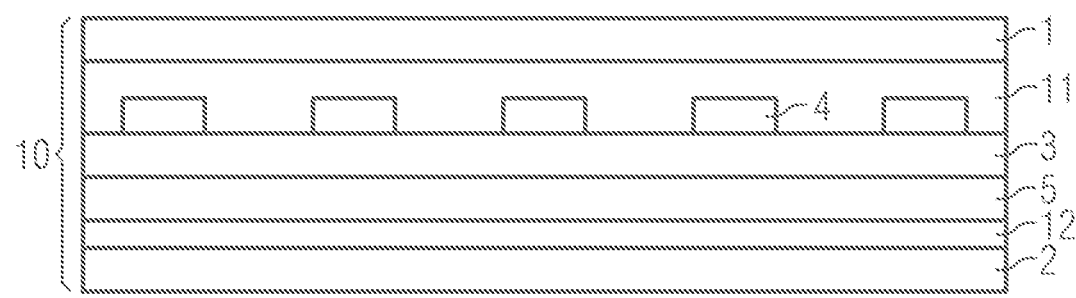
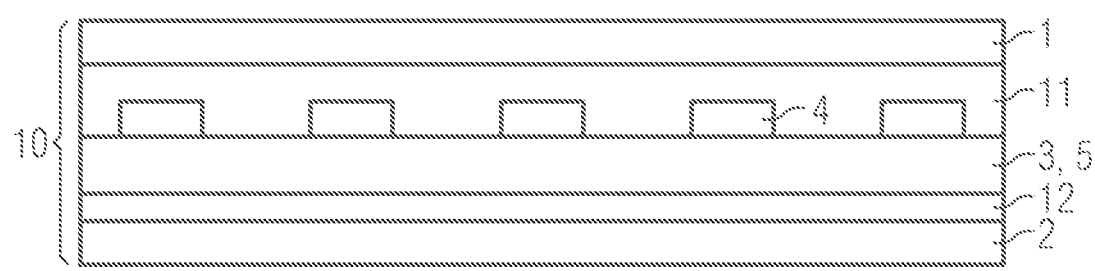

LIGHT-EMITTING WINDOW ELEMENT AND MOTOR VEHICLE COMPRISING A LIGHT-EMITTING WINDOW ELEMENT

CROSS REFERENCE TO RELATED APPLICATION

This application is a National Stage of International Application No. PCT/EP2020/071534, filed on Jul. 30, 2020, which designates the United States and was published in Europe, and which claims priority to German Patent Application No. 10 2019 121 358.4, filed on Aug. 7, 2019, in the German Patent Office. Both of the aforementioned applications are hereby incorporated by reference in their entireties.

A light-emitting window element and a motor vehicle comprising a light-emitting window element are specified.

In motor vehicles, it may be desirable for certain applications to temporarily emit light via one or more windows, for example at least one side window and/or one rear window, into the environment of the motor vehicle, for example for displaying information, while a simultaneous emission into the interior of the motor vehicle is to be avoided. In turn, when switched off, such a window is to be as transparent as possible.

It is at least one object of certain embodiments to specify a light-emitting window element. At least one further object of certain embodiments is to specify a motor vehicle comprising a light-emitting window element.

These objects are achieved by the window element and the motor vehicle according to the independent patent claims. Advantageous embodiments and further developments of the device and the method are indicated in the dependent claims and will further become apparent from the following description and the drawings.

According to at least one embodiment, a light-emitting window element comprises at least one light-emitting semiconductor chip. According to at least one further embodiment, a motor vehicle comprises a light-emitting window element. The following description refers equally to the light-emitting window element and the motor vehicle comprising the light-emitting window element. Here and in the following, expressions such as "light", "transmission" and "transparency" refer to visible light unless otherwise indicated. The light-emitting window element may be a part of a window or preferably form the window. In other words, a window may comprise the light-emitting window element or be the light-emitting window element. The terms "window" and "window element" are to be understood broadly. In particular, they may include fixed or movable windows or at least parts thereof, that is preferably planar objects which are clear translucent at least in partial regions in at least one operating state, so that in this operating state an observer can look through the light-emitting window element from a first side to a second side and vice versa. Further, these terms may also include structural elements such as walls such as partitions, doors and roofs or at least parts thereof.

According to a further embodiment, the light-emitting window element is provided and configured to emit, in a first operating state, light having a first intensity to a first side and to emit light having a second intensity to a second side at least in an emission region, the second intensity being smaller than the first intensity. Furthermore, the light emitted on the second side may be diffuse, for example. Further, the second intensity may also be zero or substantially zero, such that no light or substantially no light is emitted on the second side in the first operating state. In the first operating state, the emission region may appear opaque or at least only diffusely translucent. In a second operating state, in which the light-emitting window element does not emit light, the emission region may be more transparent than in the first operating state. In particular, the emission region may be at least partially clear translucent and thus transparent in the second operating state.

According to another embodiment, the light-emitting window element comprises a plurality of light-emitting semiconductor chips. The region in which the light-emitting semiconductor chips are arranged may form the emission region. Each of the light-emitting semiconductor chips has an active region capable of emitting light during operation of the respective semiconductor chip. Each of the light-emitting semiconductor chips may be fabricated as a semiconductor layer sequence based on different semiconductor material systems, depending on the desired wavelength to be emitted. For example, a semiconductor layer sequence based on $In_xGa_yAl_{1-x-y}As$ is suitable for long-wave infrared to red radiation, a semiconductor layer sequence based on $In_xGa_yAl_{1-x-y}P$ is suitable for red to yellow radiation, and a semiconductor layer sequence based on $In_xGa_yAl_{1-x-y}N$ is suitable for short-wave visible radiation, i.e. in particular in the range of green to blue light, and/or for UV radiation, for example, with $0 \leq y \leq 1$, $0 \leq y \leq 1$, and $x+y \leq 1$, respectively.

In particular, a light-emitting semiconductor chip, which means here and in the following exactly one light-emitting semiconductor chip or some light-emitting semiconductor chips or preferably all light-emitting semiconductor chips of the plurality of light-emitting semiconductor chips, may comprise or be a semiconductor layer sequence, particularly preferably an epitaxially grown semiconductor layer sequence. For this purpose, the semiconductor layer sequence may be grown on a growth substrate by means of an epitaxial method, for example metal-organic vapor phase epitaxy (MOVPE) or molecular beam epitaxy (MBE), and provided with electrical contacts. By separating the growth substrate with the grown semiconductor layer sequence, a plurality of light-emitting semiconductor chips can be provided. Further, the semiconductor layer sequence can be transferred to a carrier substrate before singulation, and the growth substrate can be thinned or completely removed. Such light-emitting semiconductor chips having as a substrate a carrier substrate instead of the growth substrate may also be referred to as thin-film semiconductor chips.

A thin-film semiconductor chip is characterized in particular by the following features:

a reflective layer is deposited or formed on a first main surface of a radiation-generating epitaxial layer sequence facing the carrier substrate, said reflective layer reflecting at least a portion of the electromagnetic radiation generated in the epitaxial layer sequence back into the latter;

the epitaxial layer sequence has a thickness in the range of 20 µm or less, in particular in the range between 4 µm and 10 µm; and the epitaxial layer sequence contains at least one semiconductor layer having at least one surface which has a mixing structure which ideally leads to an approximately ergodic distribution of the light in the epitaxial epitaxial layer sequence, that is to say it has a scattering behavior which is as ergodically stochastic as possible.

A thin-film semiconductor chip is, to a good approximation, a Lambertian surface emitter. The basic principle of a thin-film light-emitting diode chip is described, for example, in the publication I. Schnitzer et al., Appl. Phys. Lett. 63 (16), 18 Oct. 1993, 2174-2176.

The electrical contacts of a light-emitting semiconductor chip may be arranged on different sides of the semiconductor layer sequence or on the same side. For example, a light-emitting semiconductor chip may have an electrical contact in the form of a solderable or bondable contact area on a side of the substrate opposite the semiconductor layer sequence. On a side of the semiconductor layer sequence opposite the substrate, a further contact area may be formed, for example in the form of a so-called bond pad for making contact by means of a bonding wire. Further, a light-emitting semiconductor chip may have the electrical contact areas on the same side, for example as solderable or bondable contact areas, and may be formed as a so-called flip chip mountable with the contact areas on an electrically conductive carrier. Furthermore, a light-emitting semiconductor chip may also have two contact areas formed as bond pads on the same side of the semiconductor layer sequence.

According to a further embodiment, the light-emitting window element comprises a substrate on which at least one light-emitting semiconductor chip and preferably the plurality of light-emitting semiconductor chips are arranged. Particularly preferably, the light-emitting semiconductor chips are mounted and electrically connected on the substrate. The substrate preferably comprises a transparent material, for example in the form of a plate or foil comprising or made of glass and/or plastic.

For electrical contacting of the light-emitting semiconductor chips, the substrate preferably has conductor tracks. The conductor tracks may comprise a transparent conductive oxide and/or a metal such as copper. Transparent conductive oxides (TCOs) are transparent electrically conductive materials, usually metal oxides such as zinc oxide, tin oxide, cadmium oxide, titanium oxide, indium oxide or indium tin oxide (ITO). In addition to binary metal oxygen compounds such as, for example, $ZnO$, $SnO_2$ or $In_2O_3$, the group of TCOs also includes ternary metal oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides. Furthermore, it may be possible that the TCOs do not necessarily correspond to a stoichiometric composition and may also be p- or n-doped. In the case of conductor tracks comprising or made of metal, the conductor tracks preferably have a small width in order to have a minimal impact on the transparency of the substrate. For example, the conductor tracks have a width of a few micrometers to a few tens of micrometers. For example, the conductor tracks have a width of greater than or equal to 5 µm or greater than or equal to 10 µm and less than or equal to 50 µm or less than or equal to 20 µm. In a preferred embodiment, the conductor tracks have a width of about 15 µm.

Particularly preferably, the light-emitting window element comprises so-called micro-LEDs, i.e. light-emitting semiconductor chips having an area of less than or equal to 1 mm$^2$ and preferably of less than or equal to 0.5 mm$^2$ and particularly preferably of less than or equal to 0.1 mm$^2$. Particularly preferably, the light-emitting semiconductor chips have dimensions of less than or equal to 500 µm or less than or equal to 200 µm or less than or equal to 100 µm or less than or equal to 60 µm and greater than or equal to 10 µm. Directly adjacent light-emitting semiconductor chips preferably have a spacing of greater than or equal to 0.5 mm and less than or equal to 5 mm.

The light-emitting semiconductor chips may be part of a matrix display. In other words, the light-emitting semiconductor chips are arranged on the substrate in the form of a matrix such as a rectangular or square or hexagonal matrix and interconnected, for example, as a passive matrix or an active matrix. In particular, in the case of an active matrix, each light-emitting semiconductor chip may have one or more transistors associated therewith, which may additionally be arranged on the substrate, for example. Furthermore, each light-emitting semiconductor chip may be arranged on the substrate with its own microcarrier, wherein the microcarrier is formed, for example, as an electronic silicon component with one or more transistors, and wherein the microcarrier has dimensions which correspond at least substantially to the dimensions of the light-emitting semiconductor chip.

According to a further embodiment, the light-emitting window element comprises an optical layer having an adjustable transparency. Particularly preferably, the light-emitting semiconductor chips are applied to a side of the substrate opposite the optical layer, which is the first side described above. Accordingly, the conductor tracks for electrically contacting the light-emitting semiconductor chips are also applied to a side of the substrate opposite the optical layer.

Preferably, the optical layer comprises or is formed as an electrochromic element, a thermochromic element or a liquid crystal element. In the case of an electrochromic element or a liquid crystal element, the optical layer may comprise an electro-optical material in the form of an electrochromic material or a liquid crystal material between two electrode layers. By applying an electric voltage and/or an electric current, the transmission properties of the electro-optical material may be changed so that the transparency of the optical layer may be adjustable. In the case of a thermochromic element, the optical layer may comprise a thermochromic material that can be changed with respect to its transmission properties, for example, by the operating heat of the light-emitting semiconductor chips or by at least one heating electrode layer. For example, depending on the material of the optical layer for changing the transmission properties, properties related to scattering behavior and/or absorption and/or reflection may be changeable. The transparency may be discretely or continuously adjustable between at least two states of different transmission, which may be associated with the first and second operating states described above, depending on the configuration of the optical layer.

The optical layer may extend over the entire surface of the light-emitting window element or alternatively only over a partial surface. In particular, the optical layer is arranged above the emission region, i.e. the part of the substrate on which light-emitting semiconductor chips are arranged. By the optical layer being arranged on the second side described above as viewed from the light-emitting semiconductor chips, it is possible to cause less light generated by the light-emitting semiconductor chips or no light at all to be emitted to the second side as compared to the first side in the first operating state described above. The optical layer may be formed as a coherent functional element, and accordingly may be adjustable in its entirety with respect to its transparency. Alternatively, the optical layer may comprise a plurality of segments having separately adjustable transparency. In this way, differently transparent areas can be set for different areas of the light-emitting window element. Particularly preferably, at least one of the light-emitting semiconductor chips is arranged on at least some and preferably each of the segments.

According to a further embodiment, the light-emitting window element comprises a transparent first carrier layer and a transparent second carrier layer. The first carrier layer is arranged on the first side described above, while the second carrier layer is arranged on the second side described above. The carrier layers preferably comprise or are made of glass. Alternatively or additionally, a plastic is also possible. The substrate with the one or the plurality of light-emitting semiconductor chips and the optical layer are arranged between the first and second carrier layers. Particularly preferably, the carrier layers may be self-supporting individual layers in the form of glass layers or plastic layers or glass-plastic composite layers forming outer layers of the light-emitting window element. The carrier layers may preferably have a thickness of greater than or equal to 1 mm, for example 3 mm. In particular, in the case of single layers, the carrier layers may preferably have a thickness of less than or equal to 5 mm.

Particularly preferably, the first and second carrier layer, the substrate with the light-emitting semiconductor chips and the optical layer form a laminate composite. A first connection layer may be arranged between the first carrier layer and the substrate, preferably directly adjacent to the first carrier layer or directly adjacent to the substrate or directly adjacent to the first carrier layer and the substrate. A second connection layer may be arranged between the second carrier layer and the optical layer, preferably directly adjacent to the second carrier layer or directly adjacent to the optical layer or directly adjacent to the second carrier layer and the optical layer. Preferably, the connection layers each comprise a bonding material that bonds the respectively adjacent elements together. For example, a suitable bonding material may comprise or be polyvinyl butyral (PVB), ethylene vinyl acetate (EVA), polyacrylate (PA), polymethyl methacrylate (PMMA), and/or polyurethane (PUR). The first and second connection layers may also be portions of a single contiguous connection layer that fills the area between the first and second carrier layers, and in which the substrate with the plurality of light-emitting semiconductor chips and the optical layer are arranged. Preferably, the carrier layers may have a spacing of greater than or equal to 800 µm, wherein the substrate with the light-emitting semiconductor chips and the optical layer together have a thickness that is less than the spacing between the carrier layers. From the intermediate space which is formed by the first and second carrier layers and in which the substrate with the light-emitting semiconductor chips and the optical layer are arranged, electrical supply lines are preferably led out, by means of which the light-emitting semiconductor chips and, if applicable, the optical layer can be electrically driven. Particularly preferably, all the necessary electrical supply lines can be led out in the form of a ribbon cable. Alternatively, a connection via inductive elements and thus a contactless connection is also possible, for example.

A third connection layer may be arranged between the optical layer and the substrate. The third connection layer may have properties and characteristics as described for the first and second connection layers. Further, the optical layer may be applied, preferably directly, on the substrate. Furthermore, the optical layer may form at least part of the substrate. In other words, the optical layer may be integrated into the substrate or the optical layer may form the substrate for the light-emitting semiconductor chips.

According to a further embodiment, the motor vehicle comprises at least one window element formed at least as part of a motor vehicle window or as an entire motor vehicle window. The motor vehicle window may, for example, be selected from a side window, a rear window, a roof window and a headlight lens. The motor vehicle may also comprise a plurality of window elements, each of which is at least part of or forms a motor vehicle window. The motor vehicle is preferably a passenger car, a truck, a bus or other commercial vehicle.

For example, the light-emitting window element is at least part of a side window or a rear window or forms a side window or rear window. Furthermore, the motor vehicle may also comprise a plurality of window elements each forming part of a motor vehicle window or each forming a motor vehicle window. In the case of a side window or rear window, the light-emitting window element may in particular be formed such that the optical layer is arranged on a side of the light-emitting semiconductor chips facing an interior of the motor vehicle. As a result, it is possible to emit light into the exterior space, that is, into the environment of the motor vehicle, by means of the light-emitting semiconductor chips and, at the same time, to at least partially shield the interior space from the light emitted by the light-emitting semiconductor chips. For example, the light-emitting window element may be used to display information, for example related to autonomous driving or advertising. If the light-emitting semiconductor chips do not emit light, the light-emitting window element may preferably be transparent. Further, the light-emitting window element may be at least part of a headlamp lens, wherein the arrangement and configuration of the light-emitting window element may be as in the case of a side window or rear window.

Further, the light-emitting window element may also be part of a roof window or form a roof window. The roof window may, for example, be a panoramic roof of the motor vehicle. In the case of a roof window, the light-emitting window element may preferably be configured such that the optical layer is arranged on a side of the light-emitting semiconductor chips facing away from the interior of the motor vehicle. As a result, it may be possible to radiate light into the interior of the motor vehicle by means of the light-emitting semiconductor chips, while the light from the light-emitting semiconductor chips can be at least attenuated or completely blocked by the optical layer in the direction of the exterior. For example, this may enable suitable interior illumination of the motor vehicle when the motor vehicle is being driven, for example in the form of bluish illumination conducive to the driver's attention and alertness. At the same time, undesirable radiation of this light into the environment of the motor vehicle can be prevented. On the other hand, if the light-emitting semiconductor chips do not emit light, the light-emitting window element may be transparent. Furthermore, other applications falling within the field of "human centric lighting" are also possible. In addition, other applications from the automotive and multimarket sectors are also possible.

With the light-emitting window element described herein, it can be achieved that during light emission the light is emitted at least mainly to one side only and when the light emission is switched off the light-emitting window element is at least partially transparent. In particular, the optical layer may also prevent stray light reflected towards the second side from being at least attenuated or reflected back during light emission operation. Such stray light may occur, for example, due to surface roughness, different materials and/or different refractive indices. The control of the optical layer may be gradual or continuous in the first operating state, whereby the degree of diffuse scattering or the reflectance may be adjusted accordingly.

Further advantages, advantageous embodiments and further developments will become apparent from the exemplary embodiments described below in connection with the figures.

In the figures:

FIGS. 1A to 1D are schematic representations of a light-emitting window element according to an exemplary embodiment, FIG. 2 is a schematic representation of a light-emitting window element according to a further exemplary embodiment, FIG. 3 is a schematic representation of a light-emitting window element according to a further exemplary embodiment, and FIG. 4 is a schematic representation of a motor vehicle comprising light-emitting window elements according to a further exemplary embodiment.

In the exemplary embodiments and figures, identical elements, elements of the same kind or elements having the same effect may each be provided with the same reference signs. The elements shown and their size ratios to one another are not to be regarded as true to scale, rather, individual elements, such as layers, components, structural elements and areas, may be shown exaggeratedly large for better representability and/or for better understanding.

FIGS. 1A to 1D show an exemplary embodiment of a light-emitting window element 100. In FIG. 1A, the light-emitting window element is shown in a first operating state, while in FIG. 1B, the light-emitting window element 100 is shown in a second operating state. FIGS. 1C and 1D show sections of the light-emitting window element 100. The following description refers equally to FIGS. 1A to 1D.

The light-emitting window element 100 is provided and configured to emit, in the first operating state shown in FIG. 1A, light having a first intensity to a first side and to emit light having a second intensity to a second side at least in an emission region, the second intensity being smaller than the first intensity. In the illustrated exemplary embodiment, the emission region particularly preferably corresponds to the entire surface of the light-emitting window element 100. In the illustrated exemplary embodiment, the first side is the area that is vertically above the light-emitting window element 100 in FIGS. 1A and 1B, while the second side is the area that is vertically below the light-emitting window element 100. For example, where the light-emitting window element 100 is installed in a motor vehicle as described further below in relation to FIG. 4, the first side may be the environment of the motor vehicle, while the second side may be an interior of the motor vehicle. Alternatively, the first side may be the interior space while the second side is the exterior space and thus the environment of the motor vehicle.

In the second operating state shown in FIG. 1B, the light-emitting window element 100 does not emit light, while the emission region is more transparent than in the first operating state. As indicated in FIG. 1B, in this operating state light 99, for example from the environment, can at least partially penetrate the light-emitting window element 100. In particular, in the second operating state, the emission region and thus, in the shown exemplary embodiment, the entire light-emitting window element 100 may be at least partially clear translucent and thus transparent.

The light-emitting window element 100 comprises a transparent first carrier layer 1 and a transparent second carrier layer 2. The first carrier layer 1 is arranged on the first side described above, while the second carrier layer 2 is arranged on the second side described above. The carrier layers 1, 2 comprise or are made of glass and/or plastic. Particularly preferably, the carrier layers 1, 2 are self-supporting single layers in the form of glass layers or plastic layers or glass-plastic composite layers forming outer layers of the light-emitting window element 100. In other words, the carrier layers 1, 2 delimit the light-emitting window element 100 on the first and second sides. The carrier layers 1, 2 preferably have a thickness of greater than or equal to 1 mm, for example 3 mm. In particular, in the case of single layers, the carrier layers 1, 2 preferably have a thickness of less than or equal to 5 mm.

A substrate 3 with a plurality of light-emitting semiconductor chips 4 and an optical layer 5 are arranged between the first and second carrier layers 1, 2. As shown, the first and second carrier layers 1, 2, the substrate 3 with the light-emitting semiconductor chips 4, and the optical layer 5 form a laminate composite 10. For this purpose, a first connection layer 11 is arranged between the first carrier layer 1 and the substrate 3, as shown preferably directly adjacent to at least the first carrier layer 1 or the substrate 3 or both. A second connection layer 12 is arranged between the second carrier layer 2 and the optical layer 5, as shown preferably directly adjacent to the second carrier layer 2 or the optical layer 5 or both. Furthermore, in the shown exemplary embodiment, a third connection layer 13 is arranged between the optical layer 5 and the substrate 3, as shown particularly preferably directly adjacent thereto. The connection layers 11, 12, 13 preferably each comprise a bonding material that bonds the respectively adjacent elements together. For example, a suitable bonding material may comprise or be polyvinyl butyral (PVB) or ethylene vinyl acetate (EVA). Furthermore, other materials mentioned above in the general part for the connection layers 11, 12, 13 are also possible. The connection layers 11, 12, 13 may also be portions of a single contiguous connection layer which fills the area between the first and second carrier layers 1, 2 and in which the substrate 3 with the plurality of light-emitting semiconductor chips 4 and the optical layer 5 are arranged. Preferably, the carrier layers 1, 2 have a spacing of greater than or equal to 800 µm. Accordingly, the substrate 3 with the light-emitting semiconductor chips 4 and the optical layer 5 together have a thickness that is smaller than the distance between the carrier layers 1, 2.

The light-emitting semiconductor chips 4 are provided and configured to emit light 49 in the first operating state, which is radiated at least to the first side as described further above. As described in the general part, the light-emitting semiconductor chips 4 comprise a semiconductor layer sequence 41 including or consisting of a semiconductor material selected according to the desired wavelength to be emitted and being, for example, an arsenide, phosphide or nitride. Depending on the desired radiation characteristic, the light-emitting semiconductor chips 4 may emit light of the same color or different colors. In the exemplary embodiment shown, the light-emitting semiconductor chips 4 are purely exemplarily formed as flip chips and have electrical contacts in the form of electrodes 42 arranged on the same side of the semiconductor layer sequence 41 and with which the light-emitting semiconductor chips 4 are mounted on the substrate 3, for example, by means of a solder or an electrically conductive adhesive. Alternatively, it may also be possible that the light-emitting semiconductor chips 4 formed as flip chips are bonded with the contact pad side, i.e. the side with the electrical contacts, facing upwards using a transparent adhesive and are subsequently connected from behind using conductor tracks. In this case, the light-emitting semiconductor chips 4 radiate through the substrate 3 during operation. In this case, it may be possible, for example, that the substrate 3 with the light-emitting semiconductor chips 4 is arranged in reverse with respect to the arrangement shown in FIGS. 1A and 1B, so that the substrate 3 is arranged between the first carrier layer 1 and the light-emitting semiconductor chips 4. Alternatively, other chip designs, for example as described in the general part, are also possible.

The substrate 3 contains a transparent material, for example in the form of a plate or foil comprising or made of glass and/or plastic. For electrical contacting of the light-emitting semiconductor chips 4, the substrate 3 further comprises, for example, conductor tracks 31. The conductor tracks 31 may comprise or be made of a transparent conductive oxide such as, for example, indium tin oxide (ITO) and/or a metal such as, for example, copper. Further, other materials mentioned above in the general part are also possible. If the conductor tracks 31 are made of a non-transparent material, it is advantageous if the conductor tracks 31 are as narrow as possible in order not to influence the light transmission of the light-emitting window element 100 too much. For example, the conductor tracks 31 have a width ranging from a few micrometers to a few tens of micrometers, in particular of greater than or equal to 5 μm or greater than or equal to 10 μm and less than or equal to 50 μm or less than or equal to 20 μm. Preferably, the conductor tracks 31 have a width of about 15 μm.

The light-emitting semiconductor chips 4 can particularly preferably be designed as so-called micro-LEDs, i.e. as light-emitting semiconductor chips which have an area of less than or equal to 1 mm$^2$ and preferably of less than or equal to 0.5 mm$^2$ and particularly preferably of less than or equal to 0.1 mm$^2$. Particularly preferably, the light-emitting semiconductor chips have dimensions of less than or equal to 500 μm or less than or equal to 200 μm or less than or equal to 100 μm or less than or equal to 60 μm and greater than or equal to 10 μm. Directly adjacent light-emitting semiconductor chips preferably have a spacing of greater than or equal to 0.5 mm and less than or equal to 5 mm. In particular, the light-emitting semiconductor chips may be part of a matrix display and may be arranged on the substrate 3 in a rectangular or square or hexagonal matrix and may be interconnected, for example, as a passive matrix or an active matrix. In particular, in the case of an active matrix, one or more transistors (not shown), which may additionally be arranged on the substrate, for example, may be associated with each light-emitting semiconductor chip. Furthermore, each light-emitting semiconductor chip may be arranged on the substrate with its own microcarrier (not shown), wherein the microcarrier is formed, for example, as an electronic silicon device comprising one or more transistors, and wherein the microcarrier has dimensions which correspond at least substantially to the dimensions of the light-emitting semiconductor chip.

The optical layer 5 comprises or is formed as an electrochromic element, a thermochromic element or a liquid crystal element. In the case of an electrochromic element or a liquid crystal element indicated in a section in FIG. 1D, the optical layer 5 may comprise, for example, an electro-optical material 52 in the form of an electrochromic material or a liquid crystal material between two transparent cover layers comprising or made of glass and/or plastic and transparent electrode layers 51, for example comprising or made of a TCO. By applying an electric voltage and/or an electric current, the transmission properties of the electro-optical material 52 can be changed so that the transparency of the optical layer 5 is adjustable, as indicated in FIGS. 1A and 1B. The construction of such elements is known to those skilled in the art and will therefore not be further described herein. In the case of a thermochromic element, the optical layer 5 comprises a thermochromic material which can be changed with respect to its transmission properties, for example, by the operating heat of the light-emitting semiconductor chips 4 or by at least one heating electrode layer. The electro-optical or thermochromic material and, if applicable, the electrode layers may be arranged over a large area and in an unstructured manner, so that the optical layer 5 can be driven over a large area. The optical layer 5 may thus be formed as a coherent functional element and accordingly be adjustable in its entirety with respect to its transparency. Alternatively, as indicated by the dashed lines in FIG. 1D, the optical layer 5 and thus the mentioned elements thereof may also be structured in a plurality of segments with separately adjustable transparency. This allows different transparencies to be set for different areas of the light-emitting window element 100. Particularly preferably, at least one of the light-emitting semiconductor chips 4 is arranged on at least some and preferably each of the segments.

The emission region defined by the light-emitting semiconductor chips 4 and the optical layer 5 may each extend over the entire surface of the light-emitting window element 100, or alternatively only over a partial surface. Depending on the material of the optical layer 5 for changing the transmission properties, properties related to scattering behavior and/or absorption and/or reflection may be changeable. The transparency may be discretely or continuously adjustable between at least two states of different transmission, which may correspond to the first and second operating states described above, depending on the configuration of the optical layer. For example, the optical layer 5 may be configured such that light 49' emitted by the light-emitting semiconductor chips 4 and scattered towards the second side, for example, is reflected or absorbed as shown, so that it may be caused that, in the first operating state described above, less light 49 generated by the light-emitting semiconductor chips 4 or no light at all is emitted to the second side compared to the first side. For example, the light emitted on the second side may also be diffuse. The light-emitting window element 100 may thus appear opaque or at least only diffusely translucent in the emission region in the first operating state.

Electrical supply lines (not shown), by means of which the light-emitting semiconductor chips 4 and, if applicable, the optical layer 5 can be electrically controlled, are led out of the intermediate space which is formed between the first and second carrier layers 1, 2 and in which the substrate 3 with the light-emitting semiconductor chips 4 and the optical layer 5 are arranged. Particularly preferably, all the necessary electrical supply lines can be led out in the form of a ribbon cable. Alternatively, for example, a connection via inductive elements and thus a contactless connection is also possible.

FIGS. 2 and 3 show modifications of the light-emitting window element 100 according to further exemplary embodiments. As indicated in FIG. 2, the optical layer 5 may be directly deposited on the substrate 3. In this case, for example, one of the electrode layers of the optical layer 5 may be directly deposited on the substrate 3. In this case, the substrate 3 thus simultaneously serves as a carrier for the light-emitting semiconductor chips 4 and for the functional layers of the optical layer 5. Furthermore, it may also be possible, as is indicated in FIG. 3, for the optical layer 5 to form at least part of the substrate 3 and thus be integrated into the substrate 3. In other words, the optical layer 5 may in this case form the substrate 3 for the light-emitting semiconductor chips 4 and accordingly be provided with conductor tracks for the light-emitting semiconductor chips 4, for example, on one of the cover layers described in connection with FIGS. 1A to 1D.

FIG. 4 shows a top view of an exemplary embodiment of a motor vehicle 1000 comprising at least one or more light-emitting window elements 100 according to the previous exemplary embodiments. Purely by way of example, three light-emitting window elements 100 are shown, although the motor vehicle 1000 may also comprise fewer or more light-emitting window elements 100.

In particular, a light-emitting window element 100 may be formed as at least part of a motor vehicle window or as an entire motor vehicle window. For example, the light-emitting window element 100 is formed as a side window 1001 or at least as a part thereof. Alternatively or additionally, a light-emitting window element 100, as indicated by the dashed line, may be formed as part of a rear window 1002 or alternatively form the rear window 1002. In the case of a side window or rear window, the light-emitting window element 100 is preferably formed such that the optical layer is arranged on the side of the light-emitting semiconductor chips facing the interior of the motor vehicle 1000. As a result, in the first operating state described above, it is possible to at least partially shield the interior space from the light emitted by the light-emitting semiconductor chips and to emit light into the exterior space, that is, into the environment of the motor vehicle 1000, by means of the light-emitting semiconductor chips. For example, in this case, a light-emitting window element 100 may be used to display information, for example, related to autonomous driving or an advertisement. In the second operating state, the respective motor vehicle window may be transparent. Thus, for example, during non-autonomous operation, the transparent mode may be active in the form of the second operating state in which the light-emitting semiconductor chips are not required as indicators of vehicle-environment communication and are therefore inactive. At the same time, the field of view for the driver is not affected. In autonomous operation of the motor vehicle, in which the light-emitting semiconductor chips are active, the light-emitting window element may then be dimmed or opaque so that the light is primarily emitted to the outside and the vehicle occupants are not disturbed. Furthermore, the first operating state can also be selected in non-autonomous driving mode, since the reflections into the passenger compartment are sufficiently attenuated and there is no disturbance to the driver. In this regard, the optical layer may additionally or alternatively serve as a mirror or reflector. Further, the light-emitting window element 100 may be at least part of a headlamp lens, wherein the arrangement and configuration of the light-emitting window element 100 may be as in the case of a side window or rear window.

Alternatively or additionally, a light-emitting window element 100 may also be part of a roof window 1003 or form the roof window 1003 as shown, which is for example a panoramic roof of the motor vehicle 1000. In the case of a roof window, the light-emitting window element 100 is preferably formed such that the optical layer is arranged on a side of the light-emitting semiconductor chips facing away from the interior of the motor vehicle 1000. As a result, it is possible to radiate light into the interior of the motor vehicle 1000 by means of the light-emitting semiconductor chips, while the light from the light-emitting semiconductor chips is at least attenuated by the optical layer in the direction of the exterior. For example, during driving operation of the motor vehicle 1000 in the first operating state, this may enable suitable interior illumination of the motor vehicle, for example in the form of bluish illumination, which may promote driver attention and alertness. In the second operating state, the roof window 1003 may be transparent and function as the aforementioned panoramic roof.

The features and exemplary embodiments described in connection with the figures may be combined with each other according to further exemplary embodiments, even if not all combinations are explicitly described. Furthermore, the exemplary embodiments described in connection with the figures may alternatively or additionally have further features according to the description in the general part.

The invention is not limited to the exemplary embodiments by the description based thereon. Rather, the invention encompasses any new feature as well as any combination of features, which in particular includes any combination of features in the patent claims, even if this feature or combination itself is not explicitly stated in the patent claims or embodiments.

LIST OF REFERENCE SIGNS 1 first carrier layer
2 second carrier layer
3 substrate
4 light-emitting semiconductor chip
5 optical layer
10 laminate composite
11 first connection layer
12 second connection layer
13 third connection layer
31 conductor track
41 semiconductor layer sequence
42 electrode
49, 49' light
50 cover layer
51 electrode layer
52 electro-optical material
99 ambient light
100 light-emitting window element
1000 motor vehicle
1001 side window
1002 rear window
1003 roof window

The invention claimed is:

1. A light-emitting window element, comprising
a transparent first carrier layer and a transparent second carrier layer,
a substrate with a plurality of light-emitting semiconductor chips arranged thereon, and
an optical layer having an adjustable transparency,
wherein
the substrate with the plurality of light-emitting semiconductor chips and the optical layer are arranged between the first and second carrier layer,
the first and second carrier layer, the substrate with the plurality of light-emitting semiconductor chips and the optical layer form a laminate composite,
each of the light-emitting semiconductor chips has an area of less than or equal to 1 mm$^2$, and
directly adjacent light-emitting semiconductor chips have a spacing of greater than or equal to 0.5 mm and less than or equal to 5 mm,
a first connection layer is arranged between the first carrier layer and the substrate and directly adjacent to the first carrier layer and the substrate, and
the transparent first carrier layer comprises glass and/or plastic.

2. The light-emitting window element according to claim 1, wherein a second connection layer is arranged between the second carrier layer and the optical layer and directly adjacent to the second carrier layer and the optical layer.

3. The light-emitting window element according to claim 1, wherein conductor tracks for electrically contacting the light-emitting semiconductor chips are applied to a side of the substrate opposite the optical layer.

4. The light-emitting window element according to claim 1, wherein the light-emitting semiconductor chips are part of a matrix display.

5. The light-emitting window element according to claim 1, wherein the optical layer comprises a plurality of segments having separately adjustable transparency.

6. The light-emitting window element according to claim 5, wherein at least one of the light-emitting semiconductor chips is arranged on each of the segments.

7. The light-emitting window element according to claim 1, wherein the optical layer comprises an electrochromic element, a thermochromic element or a liquid crystal element.

8. The light-emitting window element according to claim 1, wherein the optical layer is applied on the substrate.

9. The light-emitting window element according to claim 1, wherein a third connection layer is arranged between the optical layer and the substrate.

10. The light-emitting window element according to claim 1, wherein the optical layer forms at least part of the substrate.

11. A motor vehicle comprising a light-emitting window element according to claim 1, wherein the light-emitting window element is formed as a side window or rear window and the optical layer is arranged on a side of the light-emitting semiconductor chips facing an interior of the motor vehicle.

12. The motor vehicle comprising a light-emitting window element according to claim 1, wherein the light-emitting window element is formed as a roof window and the optical layer is arranged on a side of the light-emitting semiconductor chips facing away from an interior of the motor vehicle.

13. A light-emitting window element, comprising
a transparent first carrier layer and a transparent second carrier layer,
a substrate with a plurality of light-emitting semiconductor chips arranged thereon comprising an epitaxially grown semiconductor layer sequence, and
an optical layer having an adjustable transparency,
wherein
the substrate with the plurality of light-emitting semiconductor chips and the optical layer are arranged between the first and second carrier layer,
the first and second carrier layer, the substrate with the plurality of light-emitting semiconductor chips and the optical layer form a laminate composite,
the optical layer comprises a plurality of segments having separately adjustable transparency,
a third connection layer is arranged between the optical layer and the substrate, and
the third connection layer comprises a bonding material selected from the group consisting of polyvinyl butyral, ethylene vinyl acetate, polyacrylate, polymethyl methacrylate, polyurethane, and combinations thereof.

14. A light-emitting window element, comprising
a transparent first carrier layer and a transparent second carrier layer,
a substrate with a plurality of light-emitting semiconductor chips arranged thereon, and
an optical layer having an adjustable transparency,
wherein
the substrate with the plurality of light-emitting semiconductor chips and the optical layer are arranged between the first and second carrier layer,
the first and second carrier layer, the substrate with the plurality of light-emitting semiconductor chips and the optical layer form a laminate composite,
a first connection layer is arranged between the first carrier layer and the substrate and directly adjacent to the first carrier layer and the substrate, and
a second connection layer is arranged between the second carrier layer and the optical layer and directly adjacent to the second carrier layer and the optical layer, and
the first and second connection layer are portions of a single continuous connection layer.

* * * * *